US010009038B2

(12) United States Patent
Chen

(10) Patent No.: US 10,009,038 B2
(45) Date of Patent: Jun. 26, 2018

(54) WIDEBAND NYQUIST VCO-BASED ANALOG-TO-DIGITAL CONVERTER

(71) Applicant: University of Southern California, Los Angeles, CA (US)

(72) Inventor: Shuo-Wei Chen, South Pasadena, CA (US)

(73) Assignee: UNIVERSITY OF SOUTHERN CALIFORNIA, Los Angeles, CA (US)

( * ) Notice: Subject to any disclaimer, the term of this patent is extended or adjusted under 35 U.S.C. 154(b) by 0 days. days.

(21) Appl. No.: 15/507,704

(22) PCT Filed: Sep. 2, 2015

(86) PCT No.: PCT/US2015/048110
§ 371 (c)(1),
(2) Date: Feb. 28, 2017

(87) PCT Pub. No.: WO2016/081046
PCT Pub. Date: May 26, 2016

(65) Prior Publication Data
US 2017/0310334 A1  Oct. 26, 2017

Related U.S. Application Data

(60) Provisional application No. 62/045,274, filed on Sep. 3, 2014.

(51) Int. Cl.
H03M 1/12 (2006.01)
H03M 1/14 (2006.01)
H03M 1/50 (2006.01)
H03M 1/06 (2006.01)
H03M 1/10 (2006.01)
H03M 1/60 (2006.01)

(52) U.S. Cl.
CPC ....... *H03M 1/1245* (2013.01); *H03M 1/0609* (2013.01); *H03M 1/10* (2013.01); *H03M 1/14* (2013.01); *H03M 1/502* (2013.01); *H03M 1/60* (2013.01)

(58) Field of Classification Search
CPC .......... H03M 1/60; H03M 1/10; H03M 1/502; H03M 1/14; H03M 1/0609
USPC ....................................................... 341/155
See application file for complete search history.

(56) References Cited

U.S. PATENT DOCUMENTS

| 7,609,756 | B2 * | 10/2009 | Wood ..................... | G04F 10/005 331/17 |
| 7,859,442 | B2 * | 12/2010 | Daniels ................ | G04F 10/005 341/143 |
| 8,933,831 | B2 * | 1/2015 | Oshima ............... | H03M 1/0836 341/118 |

(Continued)

*Primary Examiner* — Brian Young
(74) *Attorney, Agent, or Firm* — Snell & Wilmer L.L.P.

(57) ABSTRACT

An analog-to-digital converter may convert an analog signal into digital codes representative of the changing level of the analog signal. An analog high pass filter may receive and continuously differentiate the analog signal. A voltage controlled oscillator may receive the differentiated analog signal and continuously generates an output that is an integral of the differentiated analog signal in the phase domain. A time-to-digital converter may sample the output of the voltage controlled oscillator and convert each sample into a digital code representative of the current phase of the sampled output of the voltage controlled oscillator.

20 Claims, 6 Drawing Sheets

(56) References Cited

U.S. PATENT DOCUMENTS

| | | |
|---|---|---|
| 9,529,336 B2 * | 12/2016 | Liu .................. G04F 10/005 |
| 2003/0179123 A1 | 9/2003 | DeVilbiss |
| 2005/0057382 A1 | 3/2005 | Chen |
| 2012/0201338 A1 | 8/2012 | Leung et al. |
| 2013/0187803 A1 | 7/2013 | Kaald |
| 2014/0200850 A1 | 7/2014 | Muldowney et al. |

* cited by examiner

WIDEBAND NYQUIST VCO-BASED ANALOG-TO-DIGITAL CONVERTER

CROSS-REFERENCE TO RELATED APPLICATION

This application is based upon and claims priority to U.S. provisional patent application 62/045,274, entitled "Wideband-NyQuist VCO-Based Analog-To-Digital Converter" filed Sep. 3, 2015, the entire content of which is incorporated herein by reference.

STATEMENT REGARDING FEDERALLY SPONSORED RESEARCH

This invention was made with government support under Grant No. N00014-11-1-0819, awarded by the Office of Naval Research. The government has certain rights in the invention.

BACKGROUND

Technical Field

This disclosure relates to analog-to-digital converters.

Description of Related Art

High-speed (GS/s), medium resolution (~6 bit) ADCs are in high demand for wideband electronic systems, and many of these systems utilize AC-coupled signal paths, i.e., the communication channel blocks the close-to DC frequency components to mitigate the DC offset, flicker noise impacts, and thermal asperity. For instance, wideband wireless receivers M. S. W. Chen and R. W. Brodersen, "A subsampling radio architecture for ultrawideband communications," IEEE Trans. on Signal Processing, vol. 55, no. 10, pp. 5018,5031, October 2007; B. Afshar, Y. Wang, A. M. Niknejad, "A Robust 24 mW 60 GHz Receiver in 90 nm Standard CMOS," ISSCC Dig. Tech. Papers, pp. 182,605, 3-7 Feb. 2008, hard-drive read channels S. Gopalaswamy, P. McEwen, "Read channel issues in perpendicular magnetic recording," IEEE Trans. on Magn., vol. 37, no. 4, pp. 1929-1931, July 2001, and various wireline standards L. Lei, J. M. Wilson, S. E. Mick, J. Xu, L. Zhang, P. D. Franzon, "3 Gb/s AC-coupled chip-to-chip communication using a low-swing pulse receiver," ISSCC Dig. Tech. Papers, pp. 522, 614 Vol. 1, 10-10 Feb. 2005; J. Kim; I. Verbauwhede, M-C. F. Chang, "A 5.6-mW 1-Gb/s/pair pulsed signaling transceiver for a fully AC coupled bus," IEEE J. Solid-State Circuits, vol. 40, no. 6, pp. 1331,1340, June 2005, typically require additional DC blocking and/or high pass filtering in the receiver front end.

On the other hand, scaled CMOS technology provides increasing intrinsic device speed but lower voltage headroom. This can greatly restrict analog designs that are limited by headroom reduction. To make use of the faster speed and finer time resolutions, data converter architectures that utilize time information to quantize analog signals are emerging. They have been limited to either (a) wideband but very low resolution applications because of the non-linear voltage-to-time conversion Y. M. Tousi, E. Afshari, "A Miniature 2 mW 4 bit 1.2 GS/s Delay-Line-Based ADC in 65 nm CMOS," IEEE J. Solid-State Circuits, vol. 46, no. 10, pp. 2312,2325, October 2011, or (b) high resolution but narrowband applications, mainly due to their time quantization noise shaping property J. Kim, T. -K. Jang, Y. -G. Yoon and S. Cho, "Analysis and design of voltage-controlled oscillator based analog-to-digital converter," IEEE Trans. Circuits. Syst. I, vol. 57, no. 1, pp. 18-30, January 2010; J. Daniels, W. Dehaene, M. Steyaert, A. Wiesbauer, "A 0.02 mm² 65 nm CMOS 30 MHz BW all-digital differential VCO-based ADC with 64 dB SNDR," VLSI Circuits (VLSIC), 2010 IEEE Symposium on, pp. 155,156, 16-18 Jun. 2010.

SUMMARY

An analog-to-digital converter may convert an analog signal into digital codes representative of the changing level of the analog signal. An analog high pass filter may receive and continuously differentiate the analog signal. A voltage controlled oscillator may receive the differentiated analog signal and continuously generates an output that is an integral of the differentiated analog signal in the phase domain. A time-to-digital converter may sample the output of the voltage controlled oscillator and convert each sample into a digital code representative of the current phase of the sampled output of the voltage controlled oscillator.

The high pass filter may be entirely passive, include an AC coupling capacitor, and/or include an AC coupling capacitor.

The voltage controlled oscillator may include a multistage ring oscillator, a phase interpolator, and/or a cross-coupled network of resistors.

The time-to-digital converter may include a sense amplifier that includes a flip flop or multiple sense amplifiers connected in parallel, each of which may include a flip flop.

The analog-to-digital converter may have has a bandwidth of at least 50 megahertz, at least 75 megahertz, or at least 100 megahertz.

The analog signal may be a first single-ended analog signal that is part of a differential analog signal that may also have a second single-ended analog signal. A second analog high pass filter may receive and continuously differentiates the second single-ended analog signal. A second voltage controlled oscillator may receive the differentiated second single-ended analog signal from the second analog high pass filter and continuously generate an output that is an integral of the differentiated second single-ended analog signal in the phase domain. A second time-to-digital converter may sample the output of the second voltage controlled oscillator and convert each sample into a digital code representative of the phase of the sampled output of the second voltage controlled oscillator. A subtractor may subtract each digital code that is representative of the phase of the sampled output of the voltage controlled oscillator that receives the differentiated first single-ended analog signal from each digital code that is representative of the phase of the sampled output of the second voltage controlled oscillator.

These, as well as other components, steps, features, objects, benefits, and advantages, will now become clear from a review of the following detailed description of illustrative embodiments, the accompanying drawings, and the claims.

BRIEF DESCRIPTION OF DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION OF ILLUSTRATIVE EMBODIMENTS

Illustrative embodiments are now described. Other embodiments may be used in addition or instead. Details that may be apparent or unnecessary may be omitted to save space or for a more effective presentation. Some embodiments may be practiced with additional components or steps and/or without all of the components or steps that are described.

A Nyquist VCO-Based ADC architecture is now described for AC-coupled systems which are commonly used in high-speed wireline and wireless communications. The proposed ADC may utilize a built-in high pass filter as an analog differentiator, replacing the digital differentiator in conventional oversampling VCO-based ADCs. As a result, it may avoid quantization noise shaping and achieves wideband Nyquist operation, first order anti-aliasing filtering and improved VCO linearity without calibration. The ADC prototype may achieve peak SNDR of 34 dB and SFDR of 50 dB with over 400 MHz input bandwidth and sampling rate of 800 MS/s. It may occupy an active area of 0.01 mm² and consume 3.62 mW in 65 nm CMOS.

High pass filtering may be embedded within an ADC by exploiting the unique property of VCO transfer function while performing high-speed sampling. The objective may be to minimize the overall implementation complexity and power/area consumption via architectural innovations.

ADC Architecture

Figure 1:
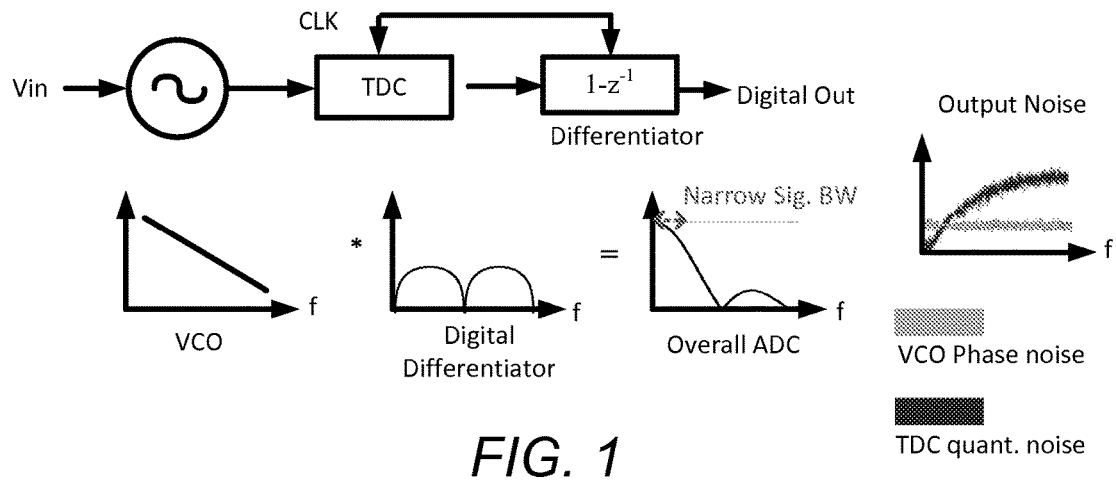
FIG. 1 illustrates a traditional implementation of a VCO-based ADC.

FIG. 1 illustrates a traditional implementation of a VCO-based ADC J. Kim, T. -K. Jang, Y. -G. Yoon and S. Cho, "Analysis and design of voltage-controlled oscillator based analog-to-digital converter," *IEEE Trans. Circuits. Syst. I*, vol. 57, no. 1, pp. 18-30, January 2010. A digital differentiator, i.e. (1-z-1), is used to calculate the phase difference between consecutive samples, which is approximately the digital representation of the analog input signal. Since the digital differentiator provides first-order noise shaping property, a time-to-digital converter (TDC) quantization noise overwhelms the high frequency spectrum. Moreover, since the signal transfer function of the conventional VCO-based ADC is a Sinc function, it leads to signal attenuation towards high input frequency—as much as 4 dB at Nyquist frequency. As a result, the VCO-based ADCs are conventionally operated in oversampling mode J. Kim, T. -K. Jang, Y. -G. Yoon and S. Cho, "Analysis and design of voltage-controlled oscillator based analog-to-digital converter," *IEEE Trans. Circuits. Syst. I*, vol. 57, no. 1, pp. 18-30, January 2010; J. Daniels, W. Dehaene, M. Steyaert, A. Wiesbauer, "A 0.02 mm² 65 nm CMOS 30 MHz BW all-digital differential VCO-based ADC with 64 dB SNDR," *VLSI Circuits (VLSIC)*, 2010 *IEEE Symposium* on, pp. 155,156, 16-18 Jun. 2010.

Figure 2:
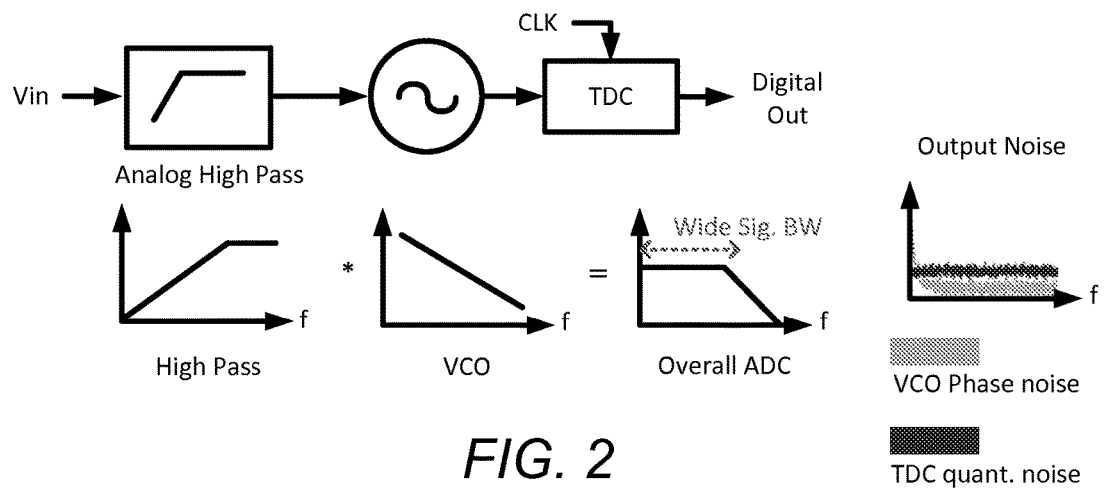
FIG. 2 is an example of a wideband Nyquist VCO-based ADC architecture that may avoid bottlenecks in the ADC illustrated in FIG. 1.

FIG. 2 is an example of a wideband Nyquist VCO-based ADC architecture that may avoid the aforementioned bottlenecks of the ADC illustrated in FIG. 1. An analog high-pass filter may be inserted prior to the VCO for several reasons. First of all, it may provide an analog differentiation function from DC to its 3-dB corner frequency. In conjunction with the continuous time integrator, i.e. the VCO, the signal gain may be unity within this band. Beyond the corner frequency, there may be a 20 dB/decade roll off in the transfer function, and results in the overall first-order anti-aliasing filter response. Secondly, since the digital differentiator is no longer present, a wideband operation may be achieved by eliminating quantization noise shaping. Additionally, the analog differentiation may attenuate the low frequency signals, reducing the voltage swing at the VCO input, and thus may improve the linearity at lower frequencies, which may be a major limiting factor of the conventional VCO-based ADCs that usually require extra calibration J. Kim, T. -K. Jang, Y. -G. Yoon and S. Cho, "Analysis and design of voltage-controlled oscillator based analog-to-digital converter," *IEEE Trans. Circuits. Syst. I*, vol. 57, no. 1, pp. 18-30, January 2010; J. Daniels, W. Dehaene, M. Steyaert, A. Wiesbauer, "A 0.02 mm² 65 nm CMOS 30 MHz BW all-digital differential VCO-based ADC with 64 dB SNDR," *VLSI Circuits (VLSIC)*, 2010 *IEEE Symposium on*, pp. 155,156, 16-18 Jun. 2010. Consequently, this approach may achieve peak SFDR of 50.1 dB at low input frequencies without any calibration.

ADC Transfer Function and Resolution

The theoretically achievable resolution and bandwidth of the proposed ADC is now derived as a function of several design parameters.

Figure 3:
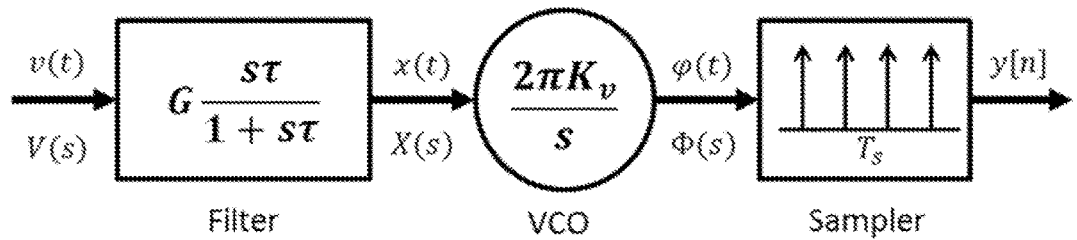
FIG. 3 illustrates a frequency domain model of the ADC illustrated in FIG. 2.

FIG. 3 illustrates a frequency domain model of the ADC illustrated in FIG. 2. As shown in FIG. 3, the input signal v(t) may be sent into a first order analog high pass filter whose response is given by $$H(s)=Gs\tau/(1+s\tau) \quad (1)$$

where τ is the filter time constant and G is the gain of the filter. Since the filter output modulates the VCO frequency, the output phase of the oscillator can be expressed as $$\Phi(s)=2\pi K_v G\tau V(s)/(1+s\tau) \quad (2)$$

where $K_v$ is the gain of the VCO in hertz/volt. The output phase of the VCO may be sampled using a time quantizer and may represent the output of the ADC. Therefore, equation (3) below shows that the ADC transfer function has a low pass nature with its bandwidth determined by the input filter cutoff frequency.

For determining the resolution of the ADC, the output in time domain will now be analyzed. The sτ term in the denominator of equation (1) can be neglected for input frequencies much lower than the cut off frequency of the filter. Hence, the transfer function may approximate a differentiator and the output of the filter, x(t), can be written as $$x(t)=G\tau v'(t) \quad (3)$$

where v'(t) is the time derivative of the input signal v(t). The filter output may modulate the VCO frequency; therefore, the output phase of the oscillator may be $$\varphi(t)=\int_0^t 2\pi K_v x(t)dt=\int_0^t 2\pi K_v G\tau v'(t)dt=2\pi K_v G\tau v(t) \quad (4)$$

φ(t) may then be sampled by the TDC, and the discrete sample can be expressed as $$Y[n]=G\tau K_v v(nT_s) \quad (5)$$

Assuming the value of v(t) lies between −A to +A, where A is the amplitude of the signal, and the TDC may quantize each time period of the VCO into M steps, each step being 2π/M radians long; the resolution N of the ADC can be derived as $$N=\log_2(2AG\tau K_v M) \quad (6)$$

According to equation (6), the value of T should be maximized for maximal ADC resolution. However, T also determines the bandwidth of the ADC as suggested by equation (2), and the maximum gain of a passive RC filter is 1. Thus, given the designed bandwidth and input amplitude, the ADC resolution may solely depend on TDC resolution and VCO gain.

Circuit Implementation

Figure 4:
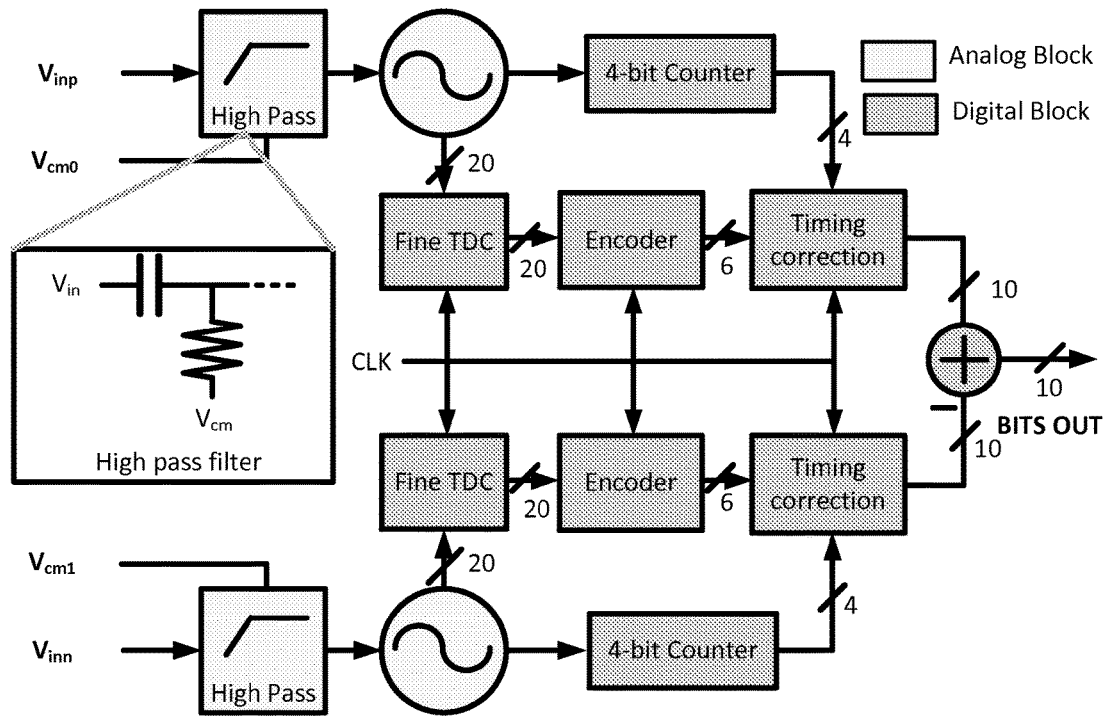
FIG. 4 is a block diagram of an ADC architecture.

FIG. 4 is a block diagram of an ADC architecture.

As illustrated in FIG. 4, the ADC may include three main sections: an AC-coupled VCO, a TDC, and a digital processing block. To further enhance the dynamic range and design robustness, the ADC may use two VCOs to construct a fully differential topology, which is referred as a dual oscillator mode herein. Not only can it reject even order harmonics, but it may also help to mitigate supply noise sensitivity.

A simulation shows that a peak supply noise of 100 mV can be suppressed by 60 dB using this fully differential design. Implementation details of the critical building blocks are now described.

AC-Coupled VCO

The AC-coupled VCO may be composed of a high-pass filter followed by a voltage controlled ring oscillator. The high-pass filter may be implemented with a first-order RC circuit that may include a poly-resistor and a metal-oxide-metal (MOM) capacitor. The corner frequency of the high-pass filter may be designed around 800 MHz to accommodate a wide input bandwidth. To avoid parasitic capacitance degrading the ADC transfer function equation (3), the series capacitance of this RC filter may be chosen sufficiently large, ~1 pf. The series resistor may be split into on-chip and off chip resistors to facilitate filter bandwidth tuning for testing purpose.

Figure 5:
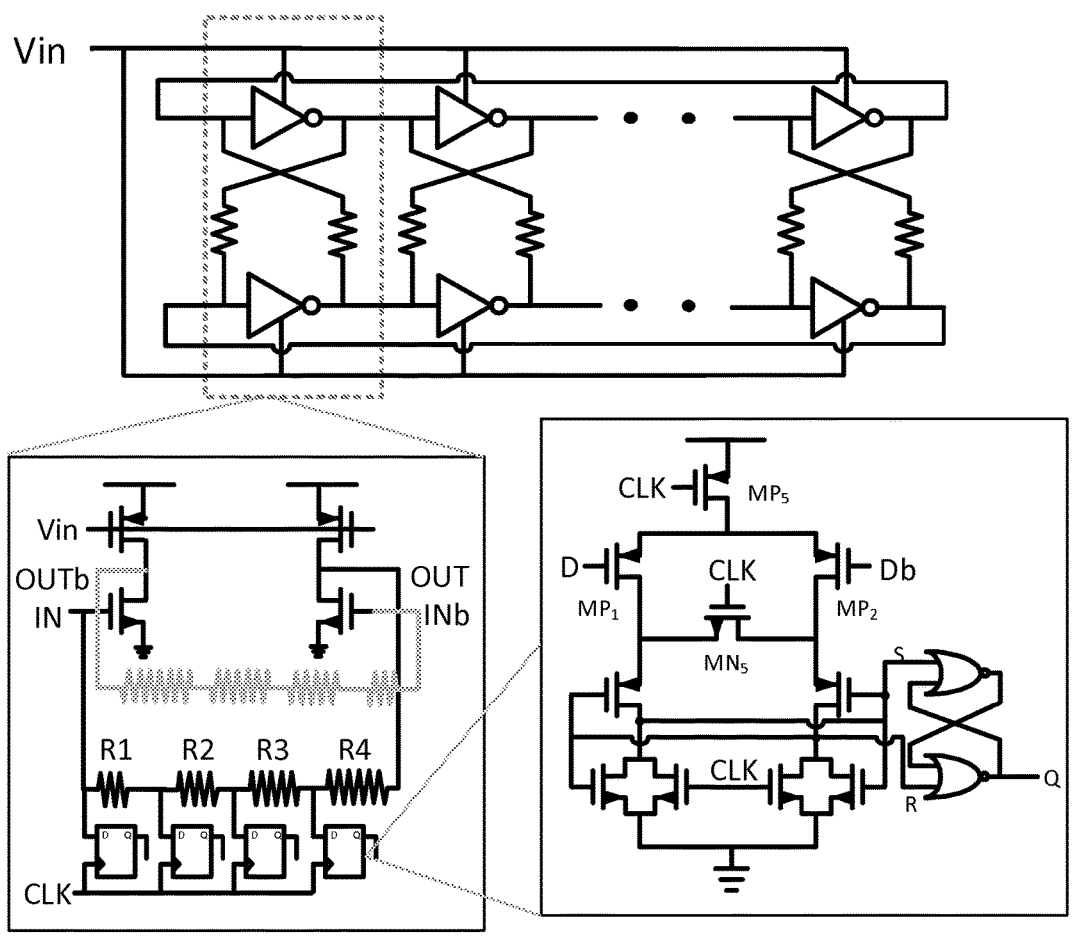
FIG. 5 illustrates an example of VCO topology with fine passive interpolation TDC and a sense amplifier flip-flop that may be used for sampling the VCO phase.

FIG. 5 illustrates an example of VCO topology with fine passive interpolation TDC and a sense amplifier flip-flop that may be used for sampling the VCO phase. As illustrated in FIG. 5, a 5-stage ring oscillator may be used as the VCO in the ADC. Each stage may include a pseudo NMOS inverter with a PMOS load. The gate of the PMOS may be controlled by the input voltage which may vary its resistance and hence the VCO oscillation frequency. This topology may be chosen over regular CMOS inverters because of better linearity over the operating range, and faster switching, shown by lower power delay products, at the cost of higher power consumption due to the static current consumption V. Beiu, J. Nyathi and S. Aunet, "Sub-Pico Joule Switching High Speed CMOS Circuits are Feasible", *The Second International Conference on Innovations in Information Technology (IIT'05)*, Sep. 26-28, 2005. The better VCO linearity together with the reduced input voltage swing as a result of the high pass filtering may make this ADC free of linearity calibration, which may be required in a conventional VCO-based ADC J. Kim, T. -K. Jang, Y. -G. Yoon and S. Cho, "Analysis and design of voltage-controlled oscillator based analog-to-digital converter," *IEEE Trans. Circuits. Syst. I*, vol. 57, no. 1, pp. 18-30, January 2010; J. Daniels, W. Dehaene, M. Steyaert, A. Wiesbauer, "A 0.02 mm² 65 nm CMOS 30 MHz BW all-digital differential VCO-based ADC with 64 dB SNDR," *VLSI Circuits (VLSIC), 2010 IEEE Symposium on*, pp. 155,156, 16-18 Jun. 2010.

Fine Time-to-Digital Conversion

The multi-phase output of the VCO may be captured by a fine TDC composed of phase interpolation and latch stage, which may serve to quantize the VCO phase information into digital codes. Phase interpolation may be implemented in between the delay stages via cross coupled resistor ladders, as shown in FIG. 5. This may enable a fine TDC resolution without additional power consumption J. Daniels, W. Dehaene, M. Steyaert, A. Wiesbauer, "A 0.02 mm² 65 nm CMOS 30 MHz BW all-digital differential VCO-based ADC with 64 dB SNDR," *VLSI Circuits (VLSIC), 2010 IEEE Symposium on*, pp. 155,156, 16-18 Jun. 2010.

Each VCO stage may be interpolated four times giving a total of twenty virtual stages which translate to forty phases of the VCO. However, the parasitic capacitances at the internal nodes of the passive RC interpolation may result in unequal delay between the phases. This can severely degrade the DNL of the TDC.

To alleviate this issue, the resistive ladder used for interpolation (R1-R4) may be individually scaled via post layout simulations, such that the delay between each stage is equalized. Another advantage of utilizing a resistor ladder across the delay stage may be improved delay mismatches between the stages due to the better matched resistors. Dummy resistors may also be added at the ends of the resistor ladder to improve matching of the layout.

After the phase interpolation, the sense amplifier flip-flops may be used to latch the phase information. When the clock is high, the flip flop may be in reset mode such that both output nodes are discharged to low. At the falling edge of the clock, the differential current between $MP_1$ and $MP_2$ may be amplified and regenerated by the positive feedback. Either one of the outputs, i.e. S or R annotated in FIG. 4, may resolve to high, which may set or reset the following NOR-based SR-latch. A PMOS input pair of the sense amplifier may be chosen because of low common voltage at the VCO output.

Digital Encoding Logic

The output of the fine TDC may be converted from cyclic thermometer code to binary representation using a ROM encoder. The outputs of the encoders may be discharged during the first half clock period, and then evaluated in the second half. The ROM operation may be completely dynamic to reduce power consumption and increase conversion speed.

The coarse TDC may be implemented using a 4 bit counter to count the VCO cycles. Digital standard cells provided by a foundry were sufficiently fast to implement the high-speed synchronous counter. Since the fine TDC may be clocked by the sampling clock, while the coarse TDC may be clocked by the faster VCO rising edges, a timing synchronizing logic may be required to combine the two results correctly. This may be achieved by re-latching the coarse TDC at the next VCO edge arriving after the sampling clock. This may ensure that the counter output is always stable while latching.

After both VCOs are sampled, they may be subtracted using a custom designed unsigned digital subtracter. Using the overflow bits generated from the coarse TDC, corrections may be made to prevent wrapping around errors, which can result in random spikes in the output code. Furthermore, the mantissa of TDC code may be scaled appropriately when combining the two sections for binary base subtraction.

Measurement Results

To properly reconstruct the ADC output waveform, the captured bits were processed as follows: firstly, since an AC-coupled system avoided frequency components close to DC, a digital high-pass filter was applied to remove the unwanted signal within this low frequency band, such as DC offset or phase noise from the VCO. In this prototype, the lower cutoff frequency of 400 KHz was designed for the high-pass filter, which sufficiently attenuated the low frequency noise component to avoid SNR degradation. This was analogous to the decimation filter used in a delta-sigma ADC.

Secondly, since two oscillators were used in this prototype for differential operation, the frequency offset between the oscillators manifested as a constant phase ramp added to the output of the ADC. The slope of this ramp was first estimated from the output codes in the foreground by shorting the input to ground, and subtracted from the output to obtain the correct waveform.

For the measurement, the silicon die was directly attached and wire bonded to the PCB board. The peak SNDR achieved was 34.1 dB and 30.6 dB at 1 MHz and 411 MHz input frequency respectively.

Figure 6A:
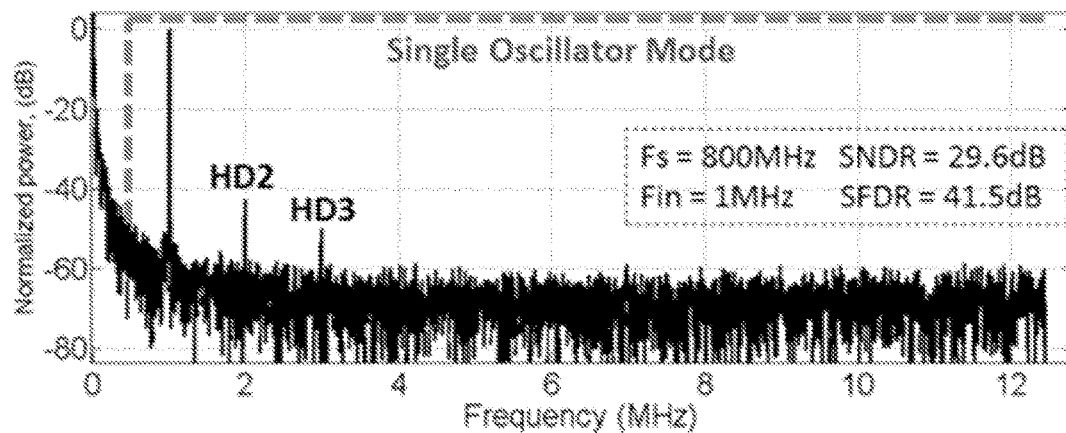
FIGS. 6A and 6B show a spectrum of a prototype ADC output in two operation modes and with a digital filter that attenuated low frequency noise.
Figure 6B:
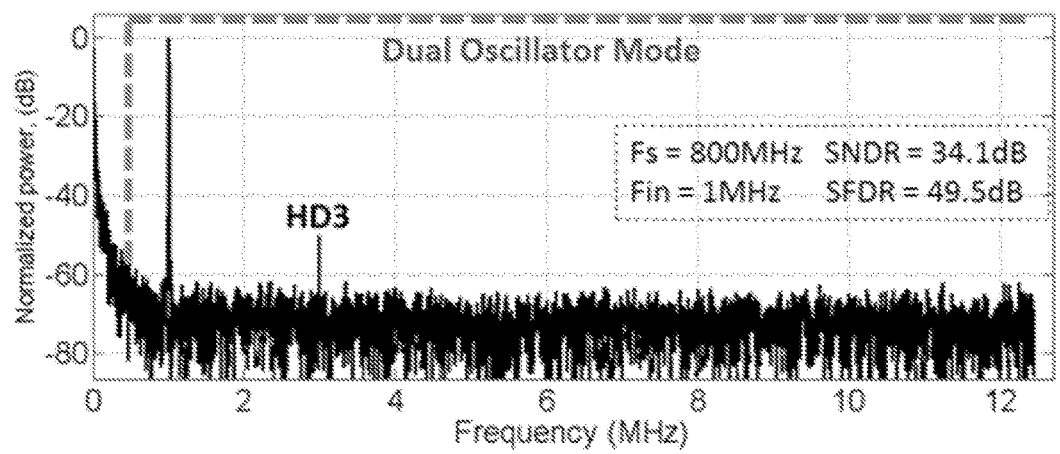

FIGS. 6A and 6B show a spectrum of the prototype ADC output in the two operation modes and with a digital filter that attenuated low frequency noise. The single oscillator mode (FIG. 6A) shows the presence of $2^{nd}$ harmonic tone. This was suppressed in the dual oscillator mode (FIG. 6B) due to the differential topology. The output was decimated by 32 folds before applying the post-processing filter annotated in the dashed line.

Figure 7A:
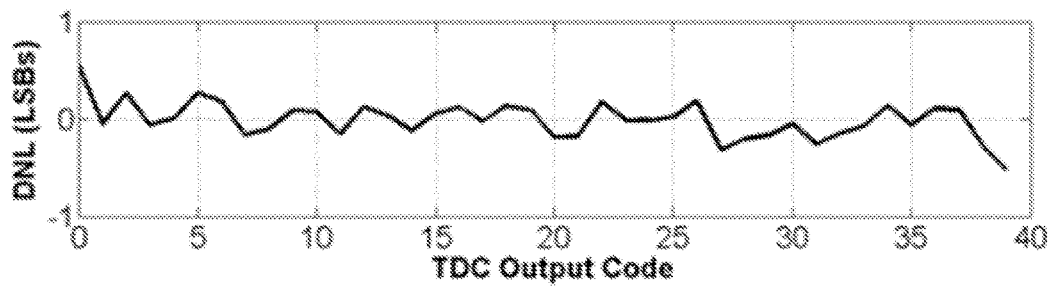
FIG. 7A illustrates a measured differential non-linearity (DNL) of all TDC codes.
Figure 7B:
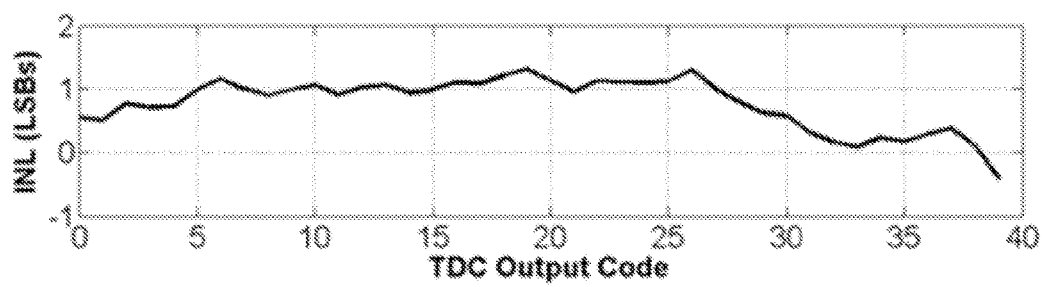
FIG. 7B illustrates a measured integral non-linearity (INL) of the TDC codes.
Figure 7C:
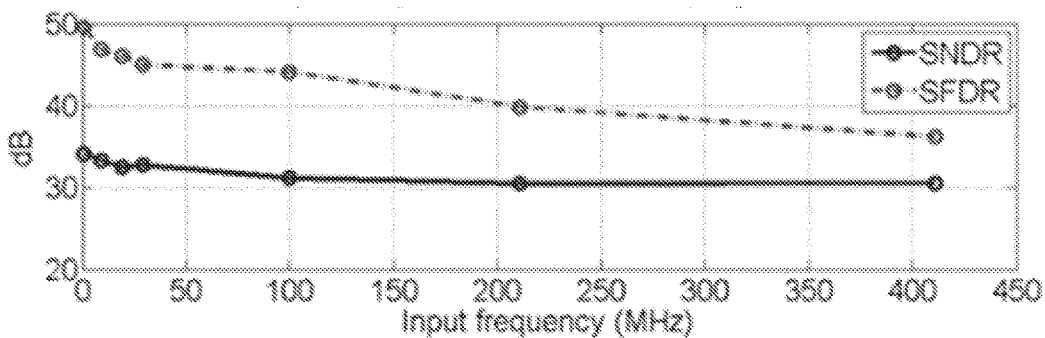
FIG. 7C illustrates a dynamic performance of an ADC, including SNDR and SFDR.

FIG. 7A illustrates a measured differential non-linearity (DNL) of all TDC codes; FIG. 7B illustrates a measured integral non-linearity (INL) of the TDC codes; and FIG. 7C illustrates a dynamic performance of an ADC, including SNDR and SFDR. A DNL of 0.55 LSBs was acheived, and an INL of 1.4 LSBs. The higher DNL at code 00 and 39 was due to extra buffer loading at the output of the VCO, which could have been improved by adding dummy loads to match the capacitances.

The ADC prototype occupied an active area of just 0.01 $mm^2$, which is smaller than other existing ADC architectures with similar specifications. The ADC dissipated just 3.62 mW of total power with the analog section consuming 2.865 mW and the digital section consuming 0.755 mW. The figure of merit (FOM) of the ADC is 123 fJ/conversion-step and 162 fJ/conversion-step at low and Nyquist frequency respectively.

Figure 8A:
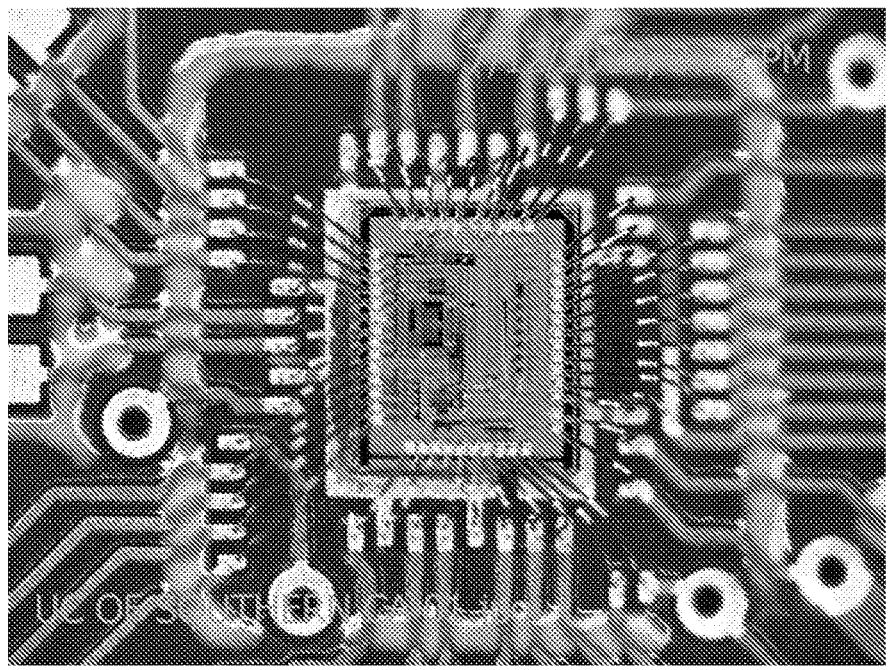
FIG. 8A is a die photo of a chip containing the prototype ADC and FIG. 8B is a block diagram of the ADC portion of the chip which is about 150 μm×120 μm.
Figure 8B:
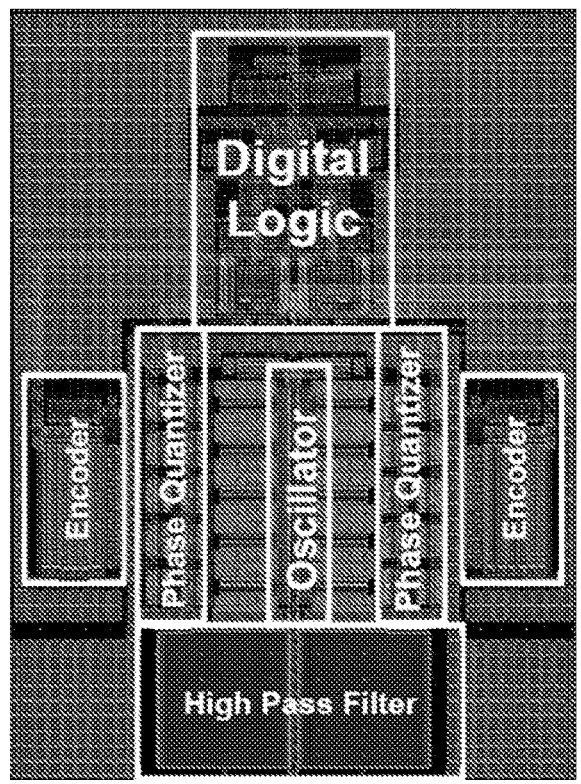

FIG. 8 is a die photo of a chip containing the prototype ADC and FIG. 8B is a block diagram of the ADC portion of the chip which is about 150 μm×120 μm.

CONCLUSION

A Nyquist AC-coupled VCO-based ADC can achieve wide input bandwidth (e.g., 400 MHz) and a high sampling rate (e.g., 800 MS/s) with low complexity. With the low power consumption and inherent AC-coupling property, the ADC may be well suited for many wireline and wireless applications. With increasing time resolution in the future scaled CMOS technologies, the proposed ADC architecture is expected to further improve the dynamic range and power efficiency with less silicon area due to its digital intensive implementation.

The components, steps, features, objects, benefits, and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, objects, benefits, and/or advantages. These also include embodiments in which the components and/or steps are arranged and/or ordered differently.

For example, the voltage controlled oscillator can be implemented in a different circuit topology instead of a ring oscillator, as long as the oscillator frequency varies with input voltage. The time-to-digital converter can also be implemented in various circuit structures, as long as it samples and quantizes the phase information into digital codes.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

All articles, patents, patent applications, and other publications that have been cited in this disclosure are incorporated herein by reference.

The phrase "means for" when used in a claim is intended to and should be interpreted to embrace the corresponding structures and materials that have been described and their equivalents. Similarly, the phrase "step for" when used in a claim is intended to and should be interpreted to embrace the corresponding acts that have been described and their equivalents. The absence of these phrases from a claim means that the claim is not intended to and should not be interpreted to be limited to these corresponding structures, materials, or acts, or to their equivalents.

The scope of protection is limited solely by the claims that now follow. That scope is intended and should be interpreted to be as broad as is consistent with the ordinary meaning of the language that is used in the claims when interpreted in light of this specification and the prosecution history that follows, except where specific meanings have been set forth, and to encompass all structural and functional equivalents.

Relational terms such as "first" and "second" and the like may be used solely to distinguish one entity or action from another, without necessarily requiring or implying any actual relationship or order between them. The terms "comprises," "comprising," and any other variation thereof when used in connection with a list of elements in the specification or claims are intended to indicate that the list is not exclusive and that other elements may be included. Similarly, an element preceded by an "a" or an "an" does not, without further constraints, preclude the existence of additional elements of the identical type.

None of the claims are intended to embrace subject matter that fails to satisfy the requirement of Sections 101, 102, or 103 of the Patent Act, nor should they be interpreted in such a way. Any unintended coverage of such subject matter is hereby disclaimed. Except as just stated in this paragraph, nothing that has been stated or illustrated is intended or should be interpreted to cause a dedication of any component, step, feature, object, benefit, advantage, or equivalent to the public, regardless of whether it is or is not recited in the claims.

The abstract is provided to help the reader quickly ascertain the nature of the technical disclosure. It is submitted with the understanding that it will not be used to interpret or limit the scope or meaning of the claims. In addition, various features in the foregoing detailed description are grouped together in various embodiments to streamline the disclosure. This method of disclosure should not be interpreted as requiring claimed embodiments to require more features than are expressly recited in each claim. Rather, as the following claims reflect, inventive subject matter lies in less than all features of a single disclosed embodiment. Thus, the following claims are hereby incorporated into the detailed description, with each claim standing on its own as separately claimed subject matte

The invention claimed is:

1. An analog-to-digital converter for converting an analog signal into digital codes representative of the changing level of the analog signal comprising:
    an analog high pass filter that receives and continuously differentiates the analog signal;
    a voltage controlled oscillator that includes a multistage ring oscillator and that receives the differentiated analog signal and continuously generates an output that is an integral of the differentiated analog signal in the phase domain; and
    a time-to-digital converter that samples the output of the voltage controlled oscillator and converts each sample into a digital code representative of the current phase of the sampled output of the voltage controlled oscillator.

2. The analog-to-digital converter of claim 1 wherein the high pass filter is entirely passive.

3. The analog-to-digital converter of claim 2 wherein the high pass filter includes an AC coupling capacitor.

4. The analog-to-digital converter of claim 1 wherein the high pass filter includes an AC coupling capacitor.

5. The analog-to-digital converter of claim 1 wherein the voltage controlled oscillator includes a phase interpolator.

6. The analog-to-digital converter of claim 1 wherein the voltage controlled oscillator includes a cross-coupled network of resistors.

7. The analog-to-digital converter of claim 6 wherein the voltage controlled oscillator includes a phase interpolator.

8. The analog-to-digital converter of claim 1 wherein the time-to-digital converter includes a sense amplifier that includes a flip flop.

9. The analog-to-digital converter of claim 8 wherein the time-to-digital converter includes multiple sense amplifiers connected in parallel, each of which includes a flip flop.

10. The analog-to-digital converter of claim 1 wherein the analog-to-digital converter has a bandwidth of at least 50 megahertz.

11. The analog-to-digital converter of claim 1 wherein the analog-to-digital converter has a bandwidth of at least 75 megahertz.

12. The analog-to-digital converter of claim 1 wherein the analog-to-digital converter has a bandwidth of at least 100 megahertz.

13. The analog-to-digital converter of claim 1 wherein the analog signal is a first single-ended analog signal that is part of a differential analog signal that also has a second single-ended analog signal and wherein the analog-to-digital converter further comprises:
    a second analog high pass filter that receives and continuously differentiates the second single-ended analog signal;
    a second voltage controlled oscillator that receives the differentiated second single-ended analog signal from the second analog high pass filter and continuously generates an output that is an integral of the differentiated second single-ended analog signal in the phase domain;
    a second time-to-digital converter that samples the output of the second voltage controlled oscillator and converts each sample into a digital code representative of the phase of the sampled output of the second voltage controlled oscillator; and
    a subtractor that subtracts each digital code that is representative of the phase of the sampled output of the voltage controlled oscillator that receives the differentiated first single-ended analog signal from each digital code that is representative of the phase of the sampled output of the second voltage controlled oscillator.

14. An analog-to-digital converter for converting an analog signal into digital codes representative of the changing level of the analog signal comprising:
    an analog high pass filter that is entirely passive and that receives and continuously differentiates the analog signal;
    a voltage controlled oscillator that receives the differentiated analog signal and continuously generates an output that is an integral of the differentiated analog signal in the phase domain; and
    a time-to-digital converter that samples the output of the voltage controlled oscillator and converts each sample into a digital code representative of the current phase of the sampled output of the voltage controlled oscillator.

15. The analog-to-digital converter of claim 14 wherein the high pass filter includes an AC coupling capacitor.

16. The analog-to-digital converter of claim 14 wherein the voltage controlled oscillator includes a phase interpolator.

17. The analog-to-digital converter of claim 14 wherein the voltage controlled oscillator includes a cross-coupled network of resistors.

18. The analog-to-digital converter of claim 14 wherein the time-to-digital converter includes multiple sense amplifiers connected in parallel, each of which includes a flip flop.

19. The analog-to-digital converter of claim 14 wherein the analog-to-digital converter has a bandwidth of at least 50 megahertz.

20. An analog-to-digital converter for converting an analog signal into digital codes representative of the changing level of the analog signal, the analog signal is a first single-ended analog signal that is part of a differential analog signal that also has a second single-ended analog signal, the analog-to-digital converter comprising:
    an analog high pass filter that receives and continuously differentiates the analog signal;
    a voltage controlled oscillator that receives the differentiated analog signal and continuously generates an output that is an integral of the differentiated analog signal in the phase domain;
    a time-to-digital converter that samples the output of the voltage controlled oscillator and converts each sample into a digital code representative of the current phase of the sampled output of the voltage controlled oscillator;
    a second analog high pass filter that receives and continuously differentiates the second single-ended analog signal;

a second voltage controlled oscillator that receives the differentiated second single-ended analog signal from the second analog high pass filter and continuously generates an output that is an integral of the differentiated second single-ended analog signal in the phase domain;

a second time-to-digital converter that samples the output of the second voltage controlled oscillator and converts each sample into a digital code representative of the phase of the sampled output of the second voltage controlled oscillator; and a subtractor that subtracts each digital code that is representative of the phase of the sampled output of the voltage controlled oscillator that receives the differentiated first single-ended analog signal from each digital code that is representative of the phase of the sampled output of the second voltage controlled oscillator.

* * * * *